United States Patent
Hayashida

(10) Patent No.: US 6,787,442 B2
(45) Date of Patent: Sep. 7, 2004

(54) METHOD OF MAKING A SEMICONDUCTOR HAVING MULTI-LAYERED ELECTRODES INCLUDING NICKEL AND PHOSPHORUS AND SOLDER FORMED WITH TIN AND AN ALKALINE EARTH METAL

(75) Inventor: Tetsuya Hayashida, Hinode (JP)

(73) Assignees: Renesas Technology Corp., Tokyo (JP); Hitachi Hokkai Semiconductor, Ltd., Hokkaido (JP)

(*) Notice: Subject to any disclaimer, the term of this patent is extended or adjusted under 35 U.S.C. 154(b) by 0 days.

(21) Appl. No.: 10/358,191

(22) Filed: Feb. 5, 2003

(65) Prior Publication Data

US 2003/0119298 A1 Jun. 26, 2003

Related U.S. Application Data

(63) Continuation of application No. 10/173,715, filed on Jun. 19, 2002.

(30) Foreign Application Priority Data

Jul. 25, 2001 (JP) ........................................ 2001-223953

(51) Int. Cl.⁷ ............................................. H01L 21/44
(52) U.S. Cl. ...................... 438/612; 438/614; 438/652; 438/654
(58) Field of Search ................................ 438/597, 612, 438/613, 614, 652, 654, 106

(56) References Cited

U.S. PATENT DOCUMENTS

| | | | |
|---|---|---|---|
| 4,626,479 A | | 12/1986 | Hosoi et al. |
| 5,909,633 A | * | 6/1999 | Haji et al. .................. 438/612 |
| 6,015,083 A | * | 1/2000 | Hayes et al. ................ 228/254 |
| 6,051,879 A | | 4/2000 | Jiang |
| 6,280,858 B1 | | 8/2001 | Teshima |
| 6,548,898 B2 | * | 4/2003 | Matsuki et al. ............. 257/746 |
| 6,570,251 B1 | | 5/2003 | Akram et al. |

FOREIGN PATENT DOCUMENTS

JP 2001-60760 3/2001

* cited by examiner

Primary Examiner—David A. Farnebe
Assistant Examiner—Scott B. Geyer
(74) Attorney, Agent, or Firm—Miles & Stockbridge P.C.

(57) ABSTRACT

By a solder bump, a CSP is bonded to a first electrode of the module substrate of a multi-chip module. For this solder bump, a solder added with an alkaline earth metal such as Ba, Be, Ca or Mg is used. Accordingly, upon solder reflow, phosphorous (P) reacts with the alkaline earth metal, thereby forming a P compound. Owing to dispersion of this P compound inside of the solder bump, no P concentrated layer is formed on the Ni film, making it possible to prevent peeling of the solder bump from the first electrode upon solder reflow. Thus, the present invention makes it possible to improve the solder bonding property.

4 Claims, 13 Drawing Sheets

PRIOR ART  FIG. 29
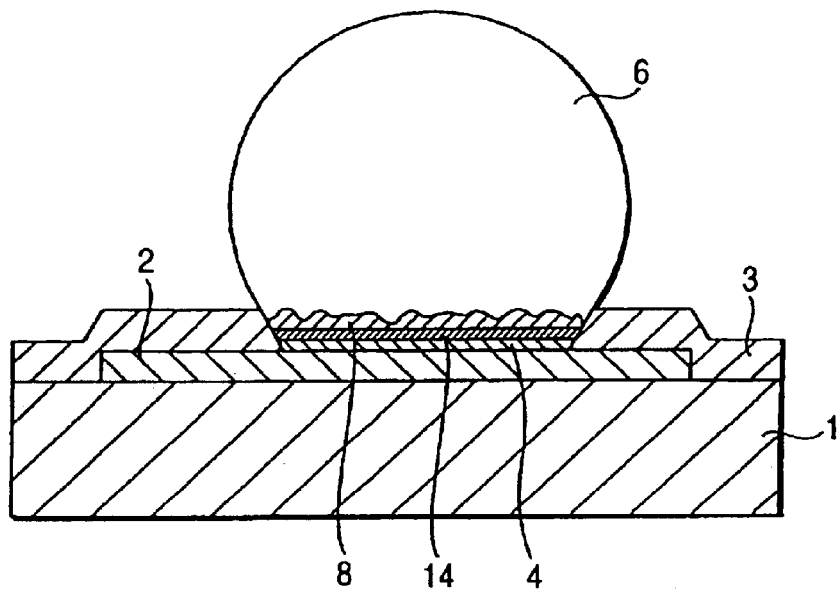
PRIOR ART  FIG. 30
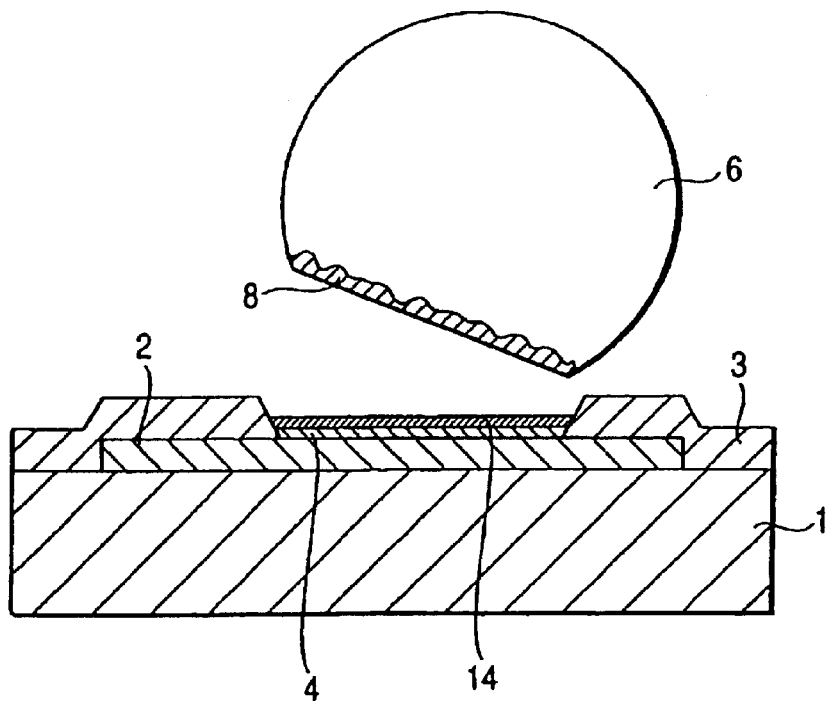

METHOD OF MAKING A SEMICONDUCTOR HAVING MULTI-LAYERED ELECTRODES INCLUDING NICKEL AND PHOSPHORUS AND SOLDER FORMED WITH TIN AND AN ALKALINE EARTH METAL

CROSS-REFERENCE TO RELATED APPLICATIONS

This application is a continuation of application Ser. No. 10/173,715 filed Jun. 19, 2002.

BACKGROUND OF THE INVENTION

The present invention relates to a manufacturing technique of semiconductor devices, particularly to a technique effective when applied to improvement of bonding property upon soldering.

Soldering is known as a bonding means of an external terminal to the electrode of a substrate upon packaging of a semiconductor device on the substrate. Instead of a conventional Pb—Sn based solder so far employed mainly, an Sn based solder free of Pb has come to be used recently.

The electrode of a substrate on which a semiconductor device is to be mounted has a structure wherein Ni—Au has been adhered to a Cu interconnect by electroplating. On this electrode, the semiconductor device is mounted using a Pb—Sn solder or an Sn solder.

Owing to a recent progress in high density packaging of a semiconductor device, it becomes difficult to adhere Ni—Au onto a Cu interconnect by electroplating. Because the smaller a semiconductor device, the greater the limitation on the wiring substrate; and interconnects for supplying power for electroplating which must be connected to each of plural electrodes on the wiring substrate cannot be formed easily by using interconnects on the wiring substrate.

In particular, as the device becomes smaller, the pitch of lands for solder bump electrodes formed over the side opposite to the principal surface of the wiring substrate (opposite-side electrodes) becomes narrow. In addition, when the electrodes are arranged in the array form with plural rows and columns over the opposite side of the wiring substrate, it becomes difficult to dispose interconnects for supplying power for electroplating between these electrodes on the opposite side.

In a multi-chip module (electronic device) having a plurality of semiconductor chips mounted thereon, signal interconnects for connecting a plurality of chips are formed over the principal surface of the wiring substrate so that it becomes difficult to form interconnects for supplying power for electroplating even over the principal surface of the wiring substrate.

As a result, a substrate having electrodes to which Ni—Au has been adhered by electroless plating has come to be used.

SUMMARY OF THE INVENTION

An Ni film is formed, for example, by electroless plating in a phosphoric acid bath. When the concentration of phosphorous in the Ni film becomes 6 wt. % or less, the quality of the Ni film deteriorates, leading to lowering in its bonding strength to a solder bump. This lowering in the bonding strength of the electrolessly-plated Ni film to the solder bump occurs because of the following reason.

On the Ni film formed by electroless plating, an Au film is formed by substitution of Au for Ni. At this time, a reaction rate (substitution rate) between Au and Ni becomes higher when the concentration of P (phosphorous) contained in the Ni film becomes lower.

When a phosphorous concentration in the Ni film is 6 wt. % or less, a penetration rate of Au shows a marked increase in an Ni crystal boundary region which has many defects and has a low density so that penetration spreads in the longitudinal direction and a penetrated portion in the form of cracks appears in the Ni film.

At the penetrated portion in the form of cracks which has appeared by marked Au penetration into the Ni film, the concentration of Ni shows a relatively large decrease. Upon melt bonding of a solder bump onto the electrode of a wiring substrate, an Sn—Ni alloy is not formed at this penetrated portion, thereby causing such a problem as lowering in the bonding strength between the solder bump and Ni film.

It is therefore preferred to incorporate at least 6 wt. %, more preferably 8 wt. % of phosphorous in the Ni film formed by electroless plating in order to improve bonding strength between the solder bump and the Ni film.

When a Pb—Sn solder or an Sn solder is molten on an electrode having an Ni film which has been formed by the above-described electroless plating and is abundant in phosphorous and the solder is bonded to the electrode, however, Ni of the Ni film penetrates into the solder side, thereby forming an Sn—Ni alloy. In general, reactivity between phosphorous and Sn is poor so that with the progress of this reaction, phosphorous (P) dispersed in the Ni film is left in the Ni film and moves toward the boundary portion between the Ni film and the reactive layer of the Sn—Ni alloy, at which boundary a highly-concentrated P layer is formed.

When this highly-concentrated P layer is formed, peeling occurs between the electrode of the substrate and the solder, resulting in a problem such as marked hindrance of the reliability of the semiconductor device.

The present inventor considered that the above-described highly-concentrated P layer causes peeling of the solder from the electrode.

A technique for imparting a soldered portion with sufficient strength by suppressing the P concentration in the P layer is described, for example, in Japanese Patent Laid-Open No. 2001-60760.

According to the technique described in the above-described gazette, the electrode of a substrate is formed to have a four-layer structure having a copper pattern, an electrolessly-plated high-concentration Ni—P film, an electrolessly-plated low-concentration Ni—P film and an electrolessly-plated gold film stacked successively in this order one after another.

By forming the electrode of a substrate to have a four-layer structure, it may be possible to suppress the P concentration in the P layer, thereby lowering the P concentration on the surface of the Ni—P film. Owing to a low concentration of P in the Ni film to be Au-plated, however, Au penetrates into the Ni film, thereby forming therein a penetrated portion in the form of cracks. This causes such a problem as lowering in the bonding strength between the solder bump and Ni film.

An object of the present invention is therefore to provide a semiconductor device improved in solder bonding property, and a manufacturing method of such a device, and an electronic device also improved in solder bonding property.

Another object of the invention is to provide a semiconductor device of high reliability and a manufacturing method of such a device, and an electronic device also of high reliability.

The above-described and other objects and novel features of the invention will be apparent from the description herein and accompanying drawings.

Of the inventions disclosed by the present application, typical ones will next be summarized.

In one aspect of the invention, there is thus provided a semiconductor device comprising a wiring substrate, a plurality of protruding electrodes formed over a plurality of electrodes of the wiring substrate, and a semiconductor chip disposed over the wiring substrate, wherein the plurality of electrodes each has a first conductor film containing Cu and a second conductor film formed between the first conductor film and the protruding electrode and containing Ni and P; the plurality of protruding electrodes are each made of a solder containing Sn and any one of Ba, Be, Ca and Mg; and the semiconductor chip is electrically connected to the protruding electrode.

In another aspect of the invention, there is also provided an electronic device comprising a wiring substrate, a plurality of first and second electrodes formed over the wiring substrate, and first and second semiconductor devices each having a plurality of electrodes, wherein the plurality of first electrodes each has a first conductor film formed over the wiring substrate and containing Cu and a second conductor film formed over the first conductor film and containing Ni and P; the plurality of second electrodes each has a third conductor film containing Cu, a fourth conductor film formed over the third conductor film and containing Ni and P, and a fifth conductor film formed over the fourth conductor film and containing Au; the plurality of electrodes of the first semiconductor device are electrically connected to the plurality of first electrodes via a solder containing Sn and any one of Ba, Be, Ca and Mg; and the plurality of electrodes of the second semiconductor device are electrically connected to the plurality of second electrodes via a plurality of Au-containing connectors.

In a further aspect of the present invention, there is also provided a manufacturing method of a semiconductor device, which comprises:

(a) preparing a wiring substrate having a plurality of electrodes each made of a first conductor film containing Cu, a second conductor film formed over said first conductor film and containing Ni and P, and a third conductor film formed over the second conductor film and containing Au, (b) melting a solder containing Sn and any one of Ba, Be, Ca and Mg over the plurality of electrodes of the wiring substrate prepared in the step (a), and (c) subsequent to said step (b), solidifying the solder over the plurality of electrodes.

BRIEF DESCRIPTION OF THE DRAWINGS

FIG. 29 is a fragmentary enlarged cross-sectional view illustrating the structure of a soldered portion of Comparative Example; and FIG. 30 is a fragmentary enlarged cross-sectional view illustrating one example of a solder bump peeled from the soldered portion of Comparative Example in FIG. 29.

DETAILED DESCRIPTION OF THE PREFERRED EMBODIMENTS

Figure 1:
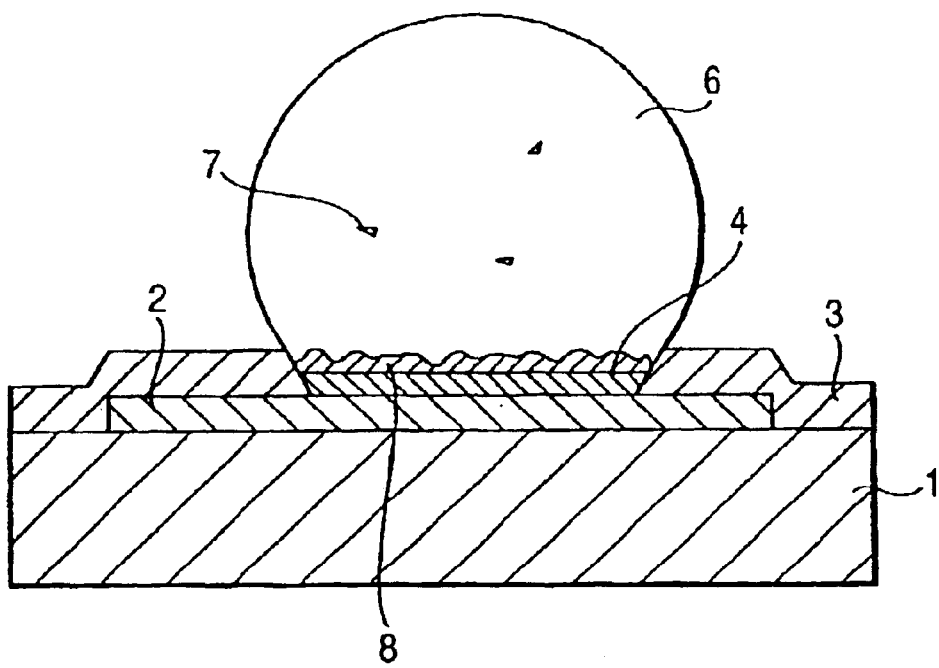
FIG. 1 is an enlarged fragmentary cross-sectional view illustrating one example of a soldering structure according to Embodiment 1 of the invention.

In the below-described embodiments, descriptions on the same or like parts will essentially be omitted unless particularly necessary.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number of elements is not limited to a specific number but can be not greater than or less than the specific number unless otherwise specifically indicated or in the case it is principally apparent that the number is limited to the specific number.

Moreover in the below-described embodiments, it is needless to say that the constituting elements (including element steps) are not always essential unless otherwise specifically indicated or in the case where it is principally apparent that they are essential.

Similarly, in the below-described embodiments, when a reference is made to the shape or positional relationship of the constituting elements, that substantially analogous or similar to it is also embraced unless otherwise specifically indicated or in the case where it is principally apparent that it is utterly different. This also applies to the above-described value and range.

(Embodiment 1)

Embodiment 1 of the present invention will next be described specifically based on the accompanying drawings. In all the drawings for describing Embodiment 1, like members of a function will be identified by like reference numerals and overlapping descriptions will be omitted.

Figure 2:
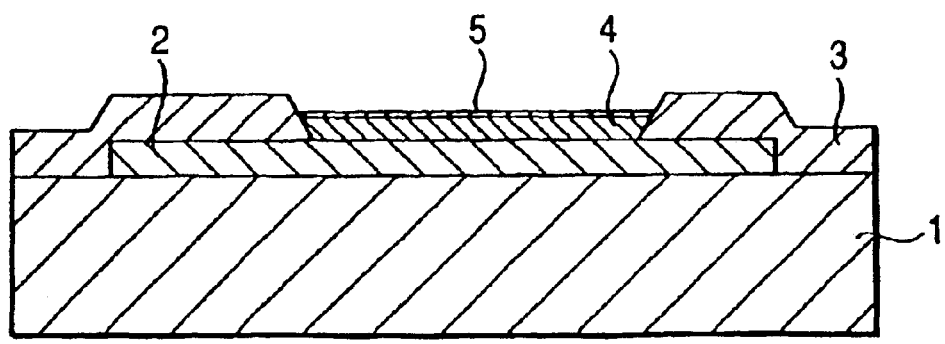
FIG. 2 is an enlarged fragmentary cross-sectional view illustrating one example of an electrode structure of a wiring substrate to which soldering as illustrated in FIG. 1 is applied.
Figure 3:
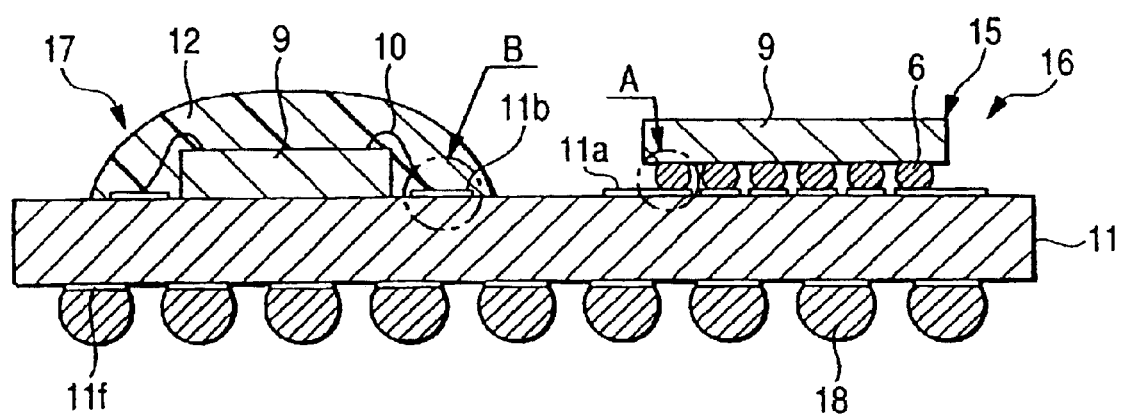
FIG. 3 is a cross-sectional view illustrating the structure of a multi-chip module which is one example of an electronic device according to Embodiment 1 of the invention.
Figure 4:
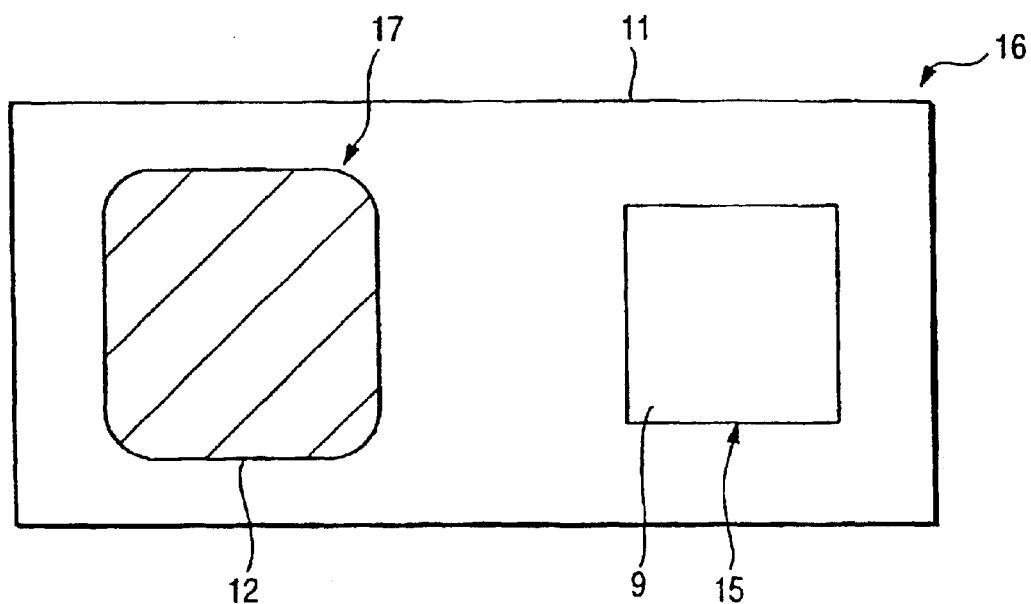
FIG. 4 is a plain view of the multi-chip module illustrated in FIG. 3.
Figure 5:
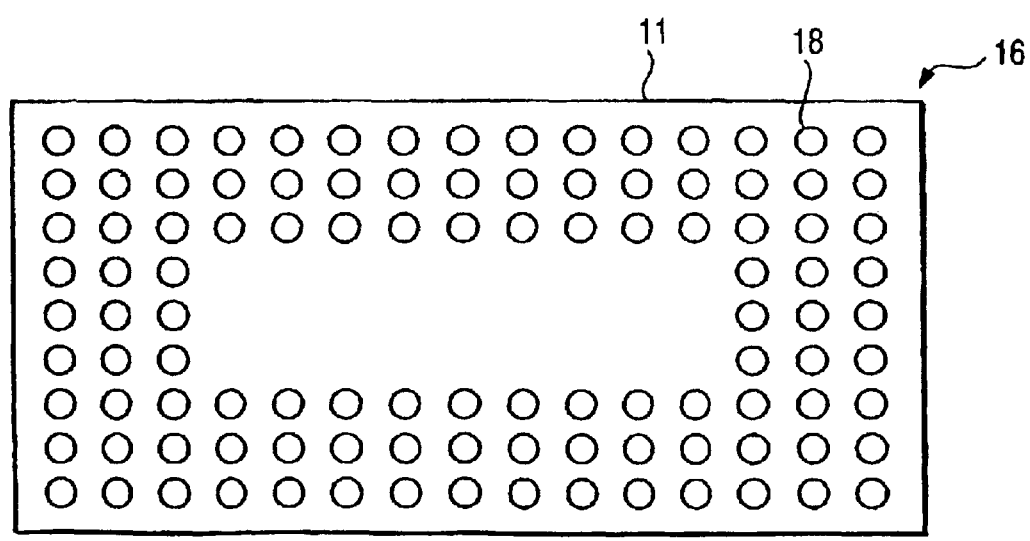
FIG. 5 is a bottom view of the multi-chip module illustrated in FIG. 3.
Figure 6:
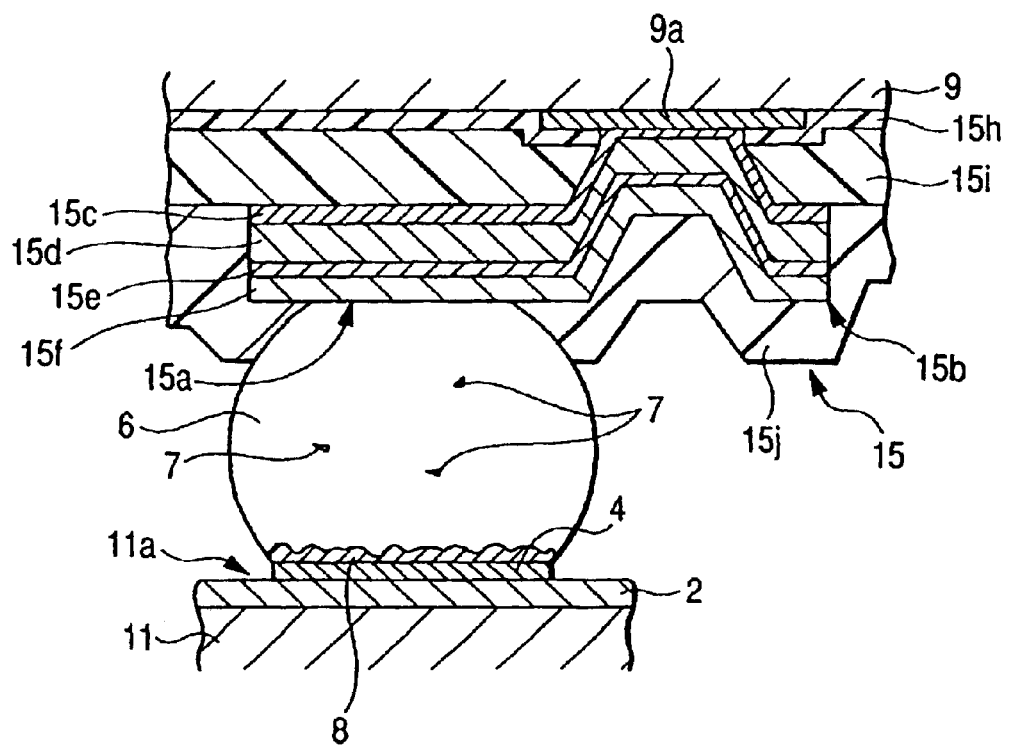
FIG. 6 is a fragmentary enlarged cross-sectional view illustrating the structure of Portion A illustrated in FIG. 3.
Figure 7:
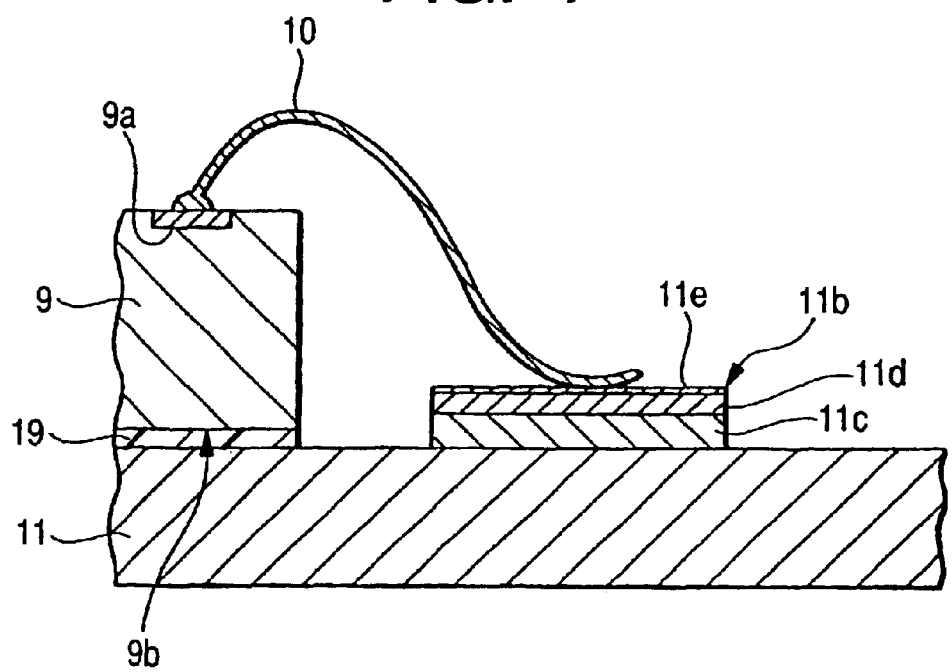
FIG. 7 is a fragmentary enlarged cross-sectional view illustrating the structure of Portion B illustrated in FIG. 3.
Figure 8:
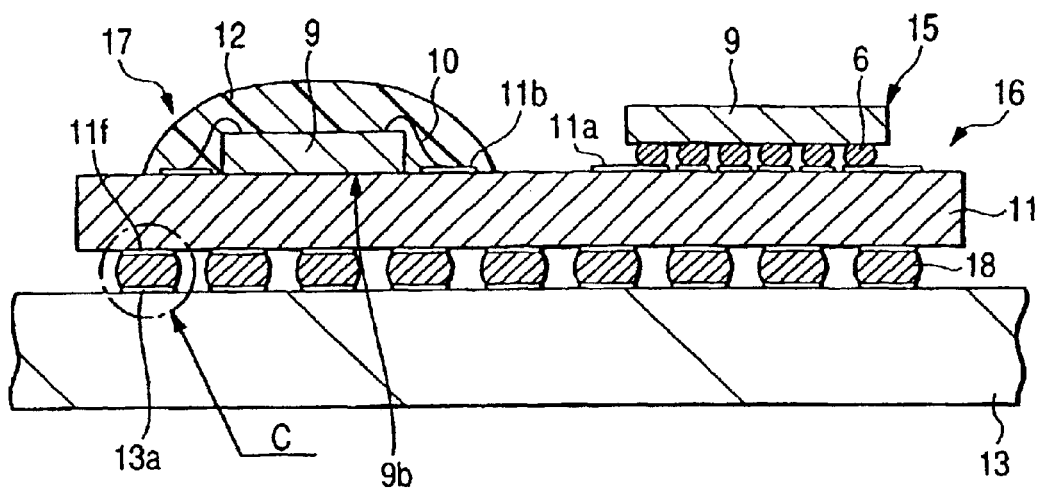
FIG. 8 is a fragmentary cross-sectional view illustrating one example of a package structure of the multi-chip module illustrated in FIG. 3.
Figure 9:
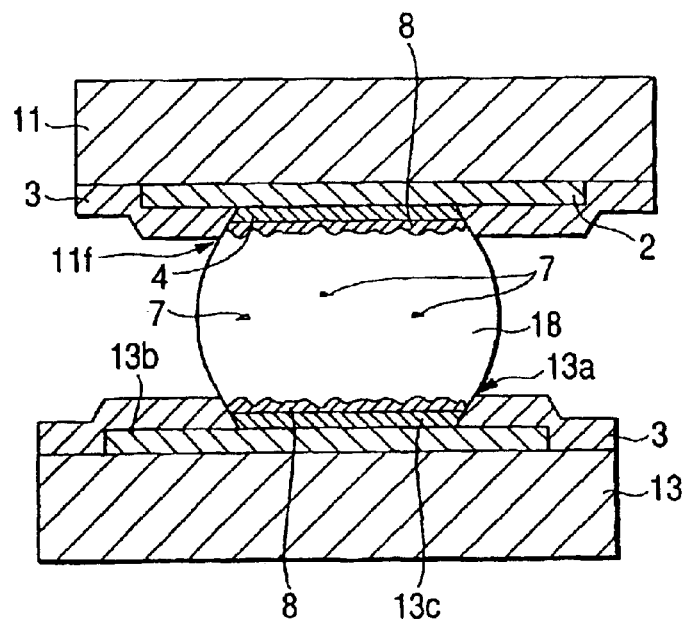
FIG. 9 is a fragmentary enlarged cross-sectional view illustrating the structure of Portion C illustrated in FIG. 8.
Figure 10:
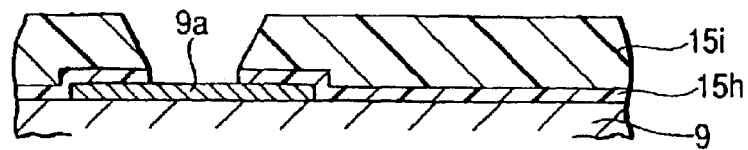
FIG. 10 is a fragmentary cross-sectional view illustrating one example of a first protective film forming step in the manufacturing procedure of a CSP mounted on the multi-chip module in FIG. 3.
Figure 17:
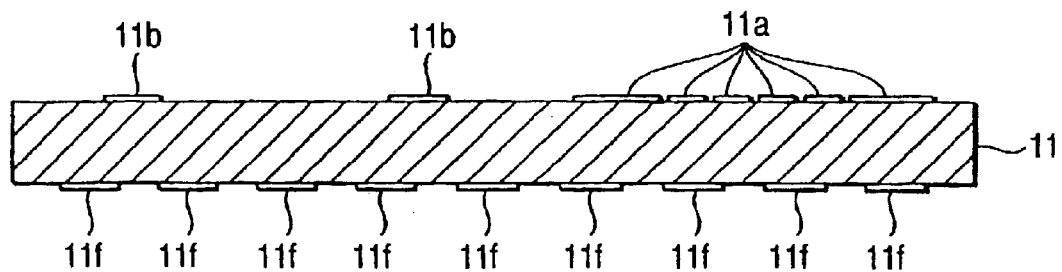
FIG. 17 is a cross-sectional view illustrating one example of a substrate preparing step in the fabrication of the multi-chip module in FIG. 3.
Figure 18:
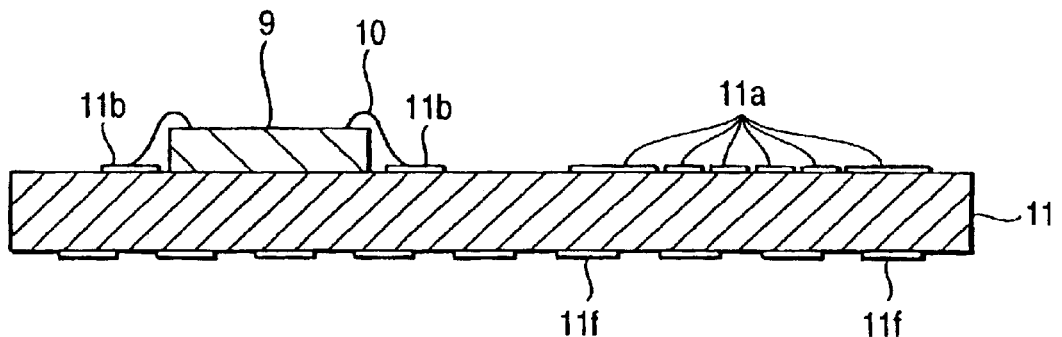
FIG. 18 is a cross-sectional view illustrating one example of a wire bonding step in the fabrication of the multi-chip module in FIG. 3.
Figure 19:
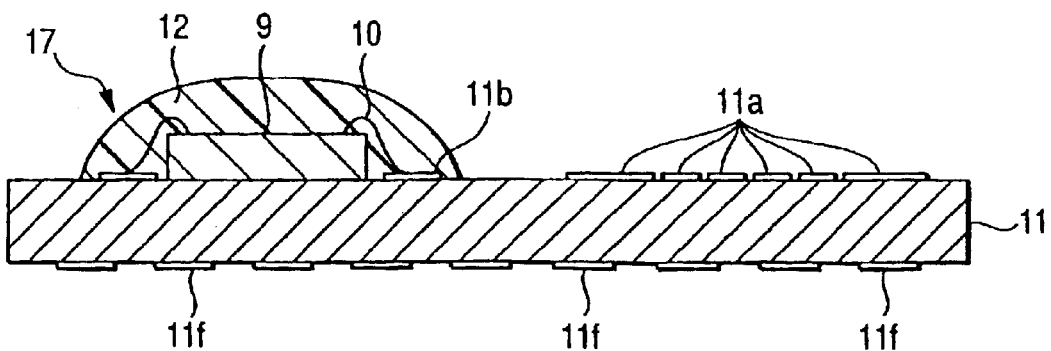
FIG. 19 is a cross-sectional view illustrating one example of a potting step in the fabrication of the multi-chip module in FIG. 3.
Figure 20:
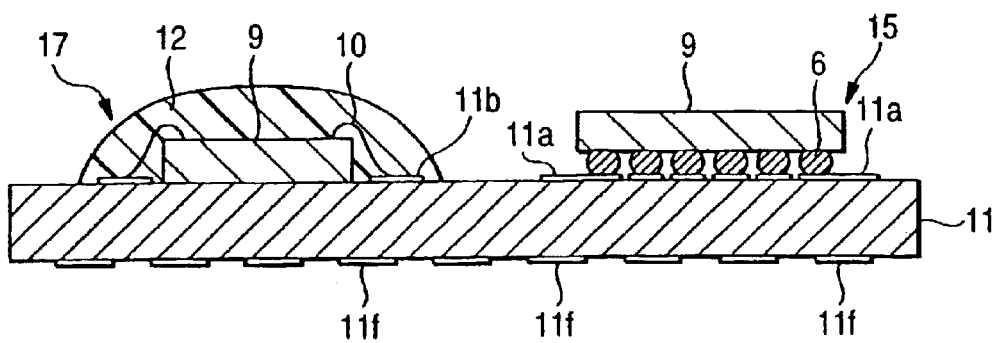
FIG. 20 is a cross-sectional view illustrating one example of a CSP mounting step in the fabrication of the multi-chip module in FIG. 3.
Figure 21:
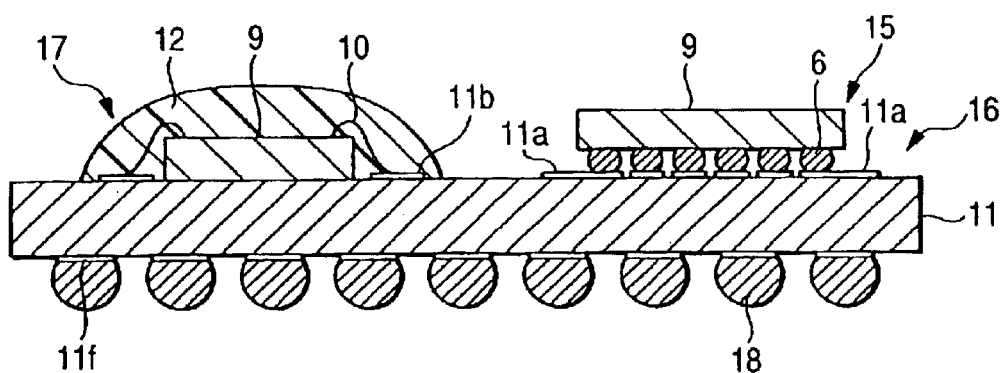
FIG. 21 is a cross-sectional view illustrating one example of an external terminal mounting step in the fabrication of the multi-chip module in FIG. 3.

FIG. 1 is an enlarged fragmentary cross-sectional view illustrating one example of a soldering structure according to Embodiment 1 of the invention; FIG. 2 is an enlarged fragmentary cross-sectional view illustrating one example of an electrode structure of a wiring substrate to which soldering as illustrated in FIG. 1 is applied; FIG. 3 is a cross-sectional view illustrating the structure of a multi-chip module which is one example of an electronic device according to Embodiment 1 of the invention; FIG. 4 is a plain view of the multi-chip module in FIG. 3; FIG. 5 is a bottom view of the multi-chip module in FIG. 3; FIG. 6 is a fragmentary enlarged cross-sectional view illustrating the structure of Portion A illustrated in FIG. 3; FIG. 7 is a fragmentary enlarged cross-sectional view illustrating the structure of Portion B illustrated in FIG. 3; FIG. 8 is a fragmentary cross-sectional view illustrating one example of a package structure of the multi-chip module in FIG. 3; FIG. 9 is a fragmentary enlarged cross-sectional view illustrating the structure of Portion C in FIG. 8; FIGS. 10 to 16 are fragmentary cross-sectional views illustrating, as one example, manufacturing steps of a CSP mounted on the multi-chip module in FIG. 3, wherein FIG. 10 illustrates a first protective film forming step, FIG. 11 a plate seed layer forming step, FIG. 12 a resist patterning step, FIG. 13 an Ni/Cu plating step, FIG. 14 a resist removing step, FIG. 15 a second protective film forming step, and FIG. 16 an Au plate layer forming step; FIG. 17 is a cross-sectional view illustrating one example of a substrate preparing step in the fabrication of the multi-chip module in FIG. 3; FIG. 18 is a cross-sectional view illustrating one example of a wire bonding step in the fabrication of the multi-chip module in FIG. 3; FIG. 19 is a cross-sectional view illustrating one example of a potting step in the fabrication of the multi-chip module in FIG. 3; FIG. 20 is a cross-sectional view illustrating one example of a CSP mounting step in the fabrication of the multi-chip module in FIG. 3; FIG. 21 is a cross-sectional view illustrating one example of an external terminal mounting step in the fabrication of the multi-chip module in FIG. 3; FIG. 29 is a fragmentary enlarged cross-sectional view illustrating the structure of a soldered portion of Comparative Example; and FIG. 30 is a fragmentary enlarged cross-sectional view illustrating one example of a solder bump peeled from the soldered portion of Comparative Example in FIG. 29.

In Embodiment 1, intended is an improvement of the bonding property of the soldered portion at an electrode of a wiring substrate formed by electroless plating.

Under a tendency of a semiconductor package to density increase or to a multi-chip formation, plated interconnects must sometimes be formed with a high density or crossed each other. In such cases, electroless plating is adopted because electroplated interconnects cannot be disposed.

Since electroplated interconnects have, as an antenna, an adverse effect on a semiconductor device used in a high-frequency region, use of electroless plating prevents plated interconnects from adversely affecting as an antenna.

The structure of the soldered portion of Embodiment 1 illustrated in FIGS. 1 and 2 will be described below.

As illustrated in FIG. 2, an insulating organic protective film 3 is formed on a Cu interconnect (first conductor film) 2 on an interposer 1 serving as a wiring substrate (which may be wiring substrate such as a module substrate 11 or mother board 13 as illustrated in FIG. 8). On an opening portion of this organic protective film 3, an Ni film (second conductor film) 4 and an Au film 5 are formed to give a thickness of about 5 $\mu$m and about 0.1 $\mu$m, respectively, by electroless plating.

This electroless Ni plating is conducted in a phosphoric (P) acid bath so that P (phosphorous) is introduced into the resulting Ni film 4. This Ni film 4 thus formed by electroless plating contains about 8 wt. % of P (phosphorous).

As illustrated in FIG. 1, after disposal of a solder bump (protruding electrode) 6 made of an Sn—Pb solder or an Sn solder on the Au film 5 of the electrode of the interposer 1 as illustrated in FIG. 2, the solder bump 6 is molten by reflow, whereby the electrode and solder bump 6 are bonded.

After completion of the reflow, Au which constitutes the Au film 5 forms an alloy with Sn in the solder bump and it disperses in the solder bump 6. On the interface between the solder bump 6 and the Ni film 4 of the electrode, an Sn—Ni alloy layer 8 as illustrated in FIG. 1 is formed to give a thickness of about 3 to 5 $\mu$m.

In Embodiment 1 of the invention, by using a solder bump 6 made of a solder added in advance with, as an additive, an alkaline earth metal such as Ba, Be, Ca or Mg and reacting P (phosphorous) in Ni with the alkaline earth metal additive such as Ba, Be, Ca or Mg in the solder upon solder reflow, a P (phosphorous) compound 7 which is a compound of the alkaline earth metal with P (phosphorous) is formed.

Described specifically, an alkaline earth metal which reacts easier with phosphorous (P) than with Sn is added in advance to a solder which will form the solder bump 6. Upon solder reflow, simultaneously with penetration of Ni in the Ni film 4 into the solder side, thereby forming the Sn—Ni alloy layer 8, phosphorous (P) in the N film 4 is caused to penetrate into the solder side, and reacted with the alkaline earth metal additive. Thus, the P compound 7 is formed. Moreover, the P compound 7 thus-formed is dispersed in the solder bump 6 in order to improve the solder bonding property while preventing generation of a P (phosphorous) concentrated layer 14 as illustrated in Comparative Example in FIG. 29.

As the additive, any one that easily reacts with phosphorous (P) and causes phosphorous (P) to move into the solder side can be used.

A description will next be made of a specific example of the above-described soldering. To a solder (Sn solder) containing Sn, 3 wt. % of Ag and 0.5 wt. % of Cu, about 0.1 wt. % of Mg which is an additive reactive with phosphorous (P) is added (the resulting solder mixture will hereinafter be called "Sn/3Ag/0.5Cu/0.1Mg solder").

3 wt. % Ag contained in the solder forms an alloy with Sn, thereby having effects for lowering the melting point, while 0.5 wt. % Cu has effects for suppressing the growth of the Sn—Ni alloy.

In FIG. 1, illustrated is a wiring substrate such as interposer 1 having an electrode subjected to electroless Ni—Au plating. To this substrate, an Sn/3Ag/0.5Cu/0.1Mg solder is bonded by reflow.

In this case, as illustrated in FIG. 1, a trace amount of $Mg_3P_2$ which is a P compound 7 has been dispersed in the solder bump 6 and a P concentrated layer 14 as shown in Comparative Example in FIG. 29 is not formed in the Ni film 4.

As a result, the solder bump 6 and electrode of the wiring substrate show stable bonding and such peeling of the solder bump 6 at the P concentrated layer 14 as shown in Comparative Example 30 does not occur, making it possible to improve the reliability of soldering.

Thus, reliability of the solder connection can be improved in this embodiment.

It is to be noted that the solidified solder bump 6 contains $Mg_3P_2$ as the P compound 7.

At the boundary between the Ni film 4 and the Sn—Ni alloy layer 8, a thin P (phosphorous) layer may be formed partially unless it disturbs and deteriorates the bonding strength between the solder bump 6 and the electrode of the wiring substrate.

Described above was soldering using Mg as an additive, more specifically, soldering by adding 0.1 wt. % Mg to an Sn/3 wt. % Ag/0.5 wt. % Cu solder (Sn solder). Similar effects are available even if not Mg but an alkaline earth metal other than Mg such as Ba, Be or Ca is added.

For example, the P compound 7 obtained by the addition of Ba, Be or Ca is $BaP_3$, $Be_3P_2$ or $Ca_3P_2$, respectively. Since such a P compound 7 is dispersed in the solder bump 6, neither formation of the P concentrated layer 14 as illustrated in FIG. 29 nor peeling of the solder bump 6 occurs.

Not only the Sn solder but also Sn—Pb solder can bring about similar effects.

A multi-chip module (electronic device) 16, as illustrated in FIG. 3, to which the solder connection of Embodiment 1 has been applied will next be described.

The multi-chip module 16 has a module substrate 11 which is a wiring substrate, a plurality of first electrodes 11a and a plurality of second electrodes 11b each formed over the module substrate 11, and a CSP (Chip Size Package) 15 (first semiconductor device) and a second semiconductor device 17 each having a plurality of electrodes.

Here, the multi-chip module 16 having two semiconductor devices mounted thereon will be described, but any number of semiconductor devices, either singular or plural, can be mounted.

As illustrated in FIG. 6, each of a plurality of first electrodes 11a has a Cu interconnect 2 (first conductor film) formed over the module substrate 11 and containing Cu and an Ni film 4 (second conductor film) formed over the Cu interconnect 2 and containing Ni and P.

As illustrated in FIG. 7, on the other hand, each of a plurality of second electrodes 11b has a Cu interconnect 11c (third conductor film) formed over the module substrate 11 and containing Cu, an Ni film 11d (fourth conductor film) formed over the Cu interconnect 11c and containing Ni and P, and an Au film 11e formed over the Ni film 11d and containing Au.

As illustrated in FIG. 6, surface electrodes 15a, which are plural electrodes of the CSP 15, are electrically connected to the plurality of first electrodes 11a via a plurality of solder bumps 6 each containing Sn and any one of Ba, Be, Ca and Mg.

A plurality of Al pads 9a (refer to FIG. 7) which are a plurality of electrodes of the second semiconductor device 17 are electrically connected to the plurality of second electrodes 11b via a plurality of Au wires 10 which are Au-containing connectors.

In other words, on the module substrate 11, the CSP 15 which is a first semiconductor device is mounted over the plurality of first electrodes 11a via the plurality of solder bumps 6 as illustrated in FIG. 1, while the semiconductor chip 9 constituting the second semiconductor device 17 is connected to the plurality of second electrodes 11b via the Au wires 10.

The solder bumps 6 connecting the CSP 15 are similar to those illustrated in FIG. 1. The CSP 15 is bonded to the first electrodes 11a of the module substrate 11 by conducting solder reflow with a solder added with an alkaline earth metal additive such as Ba, Be, Ca or Mg. Accordingly, upon solder reflow, phosphorous (P) reacts with the alkaline earth metal, thereby forming a P compound. This P compound has been dispersed inside of the solder bumps 6 so that in the Ni film 4 illustrated in FIG. 6, such a P concentrated layer 14 as illustrated in FIG. 29 is not formed.

Peeling of the solder bumps 6 from the electrodes 11a upon solder reflow can therefore be prevented.

The plurality of first electrodes 11a and the plurality of second electrodes 11b on the module substrate 11 are formed in one step. The Ni—Au film of both electrodes are formed by electroless Ni plating. As illustrated in FIG. 6, an Au film 11e as illustrated in FIG. 7 is not formed on the surface of the first electrode 11a, because the Au film 11e is molten and enters in the solder by solder reflow.

On the Ni film 4, the Sn—Ni alloy layer 8 is formed.

The solder bump 6 contains therein Sn and the P compound 7.

As illustrated in FIG. 7, the Al pad 9a of the semiconductor chip 9 of the second semiconductor device 17 (refer to FIG. 3) is connected with the Au wire 10 and this Au wire 10 is bonded, by Au—Au bonding, to the Au film 11e which is the upper most layer of the second electrode 11b of the module substrate 11.

In short, the Au wire 10 is bonded to the second electrode 11b of the module substrate 11 by Au—Au bonding which is a solder-free wire bonding.

The Au film 11e remains as the uppermost layer because it is not molten upon Au—Au bonding.

As illustrated in FIGS. 3 and 4, the semiconductor chip 9 and the plurality of Au wires 10 are resin-sealed with a sealing resin 12 which has been dropped by potting.

In the multi-chip module 16, as illustrated in FIG. 3 and FIG. 5, a plurality of solder external electrodes 18 in the ball form are disposed as external terminals on the side of the module substrate 11 opposite to the principal surface having, mounted thereon, the CSP 15 and second semiconductor device 17. These solder external electrodes 18 are arranged in the form of array composed of plurality of row and columns.

The solder external electrodes 18 are made of a material used for the solder bumps 6 but are larger than the solder bumps 6.

Described specifically, the solder external electrodes 18 are bonded to the electrodes 11f (which will hereinafter be called "opposite-side electrodes") on the side opposite to the principal surface of the module 11 by solder reflow of a solder added with an alkaline earth metal such as Ba, Be, Ca or Mg. Accordingly, upon solder reflow, phosphorous (P) reacts with the alkaline earth metal, thereby forming a P compound 7. Owing to dispersion of this P compound 7 inside of the solder external electrode 18, a P concentrated layer as illustrated in FIG. 29 is not formed on the Ni film 4 illustrated in FIG. 9.

It is therefore possible to prevent peeling of the solder external electrodes 18 from the opposite-side electrodes 11f on the module subtrate 11 upon solder reflow.

In FIG. 8, illustrated is the package form of the multi-chip module 16 in FIG. 3.

The package structure of a multi-chip module 16 has, as illustrated in FIG. 8 and FIG. 9, a module substrate 11 serving as a first wiring substrate, a plurality of opposite-side electrodes 11f serving as first electrodes on the side opposite to the principal surface of the module substrate 11, a mother board 13 serving as a second wiring substrate, a plurality of surface-side electrodes 13a serving as second electrodes on the mother board 13, a plurality of solder external electrodes 18, which are protruding electrodes for connecting the plurality of opposite-side electrodes 11f to the plurality of surface electrodes 13a, and a semiconductor chip 9 and a CSP 15 which are electrically connected to the plurality of surface-side electrodes 13a via the plurality of opposite-side electrodes 11f and the plurality of solder external electrodes 18.

Each of the plurality of opposite-side electrodes 11f or each of the plurality of surface-side electrodes 13a has a Cu interconnect 2 or 13b containing Cu and serving as a first conductor film, and an Ni film 4 or 13c formed over the Cu interconnect 2 or 13b, containing Ni and P and serving as a second conductor film, respectively.

The plurality of solder external electrodes 18 each contains Sn and an alkaline earth metal such as Ba, Be, Ca or Mg.

By conducting solder reflow to bond the plurality of solder external electrodes 18 to the opposite-side electrodes 11f of the module substrate 11 and surface-side electrodes 13a of the mother board 13, phosphorous (P) and the alkaline earth metal reacts to form the corresponding P compound 7. The resulting P compound 7 has been dispersed in each of the solder external electrodes 18 so that a P concentrated layer 14 as illustrated in FIG. 29 is formed neither on the Ni film 4 nor on the Ni film 13C illustrated in FIG. 9.

Upon formation of the P compound 7, Sn on the solder side and Ni of the Ni film 4 or Ni film 13c react each other to form an Sn—Ni alloy layer 8 on the Ni film 4 or Ni film 13c. In other words, the Sn—Ni alloy layer 8 is formed between each of the Ni film 4 and Ni film 13c serving as the second conductor film and the solder external electrode 18 disposed thereon.

The module substrate 11 or mother board 13 is, for example, a glass-containing epoxy substrate so that the thermal expansion coefficient of the module substrate 11 or mother board 13 is greater than that of the semiconductor chip 9.

The semiconductor chip 9 is, as illustrated in FIG. 7, has a first principal surface 9b fixed, via an adhesive material 19, onto the module substrate 11 serving as a first wiring substrate. At the same time, the plurality of solder external electrodes 18 are disposed between the first principal surface 9b of the semiconductor chip 9 and the mother board 13.

The module substrate 11 or mother board 13 is, for example, a glass-containing epoxy substrate so that it has an insulating layer made of an organic resin.

When the multi-chip module having a structure as illustrated in FIG. 3 is packaged in the form as illustrated in FIG. 8, a large stress is applied to the boundary portion between the solder bumps 6 or solder external electrodes 18 and the corresponding underlying second conductor films (Ni films 4, Ni films 13c), because there is a large difference in the thermal expansion coefficient between the semiconductor chip 9 and the module substrate 11 or mother board 13 upon solder reflow for mounting thereon the solder bumps 6 or solder external electrodes 18; each semiconductor chip 9 is fixed to the module substrate 11 with the adhesive material 19; and the Sn/Ni alloy layer 8 is formed between each of the solder bumps 6 and each of the second conductor films (Ni films 4, Ni films 13c). Soldering as illustrated in FIG. 1, however, improves solder bonding property, thereby making it possible to prevent peeling of the solder bumps 6 or solder external electrodes 18.

In the multi-chip module 16, the Cu interconnect 2 serving as a first conductor film as illustrated in FIG. 6 and the Cu interconnect 11c serving as a third conductor film as illustrated in FIG. 7 are sometimes integrally formed over the module substrate 11.

For example, when the multi-chip module 16 is a memory module having a plurality of semiconductor chips 9 mounted on the module substrate 11, the Cu interconnect 2 and Cu interconnect 11c are integrally formed in one step as an interconnect for connecting the plurality of chips.

In such a structure, electrodes are formed by electroless Ni—Au plating so that even a multi-chip module 16 having a high wiring density does not need power supplying interconnects, which are on the other hand necessary when electroplating is adopted, making it possible to reduce the size of the multi-chip module.

This structure enables to actualize a multi-chip module 16 having improved solder bonding property and having high wiring density, leading to an improvement in the reliability of the multi-chip module 16.

It is particularly effective for the multi-chip module 16 requiring electroless plating such as electroless Ni—Au plating.

Even in the semiconductor chip 9 of a narrow pad pitch, it enables free wiring on the module substrate 11 (including the interposer as shown in FIG. 1).

The CSP 15 mounted on the multi-chip module 16 as illustrated in FIG. 3 has a surface electrode 15a of a wide pitch for external connection which electrode has been substituted upon disposal of the Al pad 9a of the semiconductor chip 9 at relatively narrow pitches. In the form of a semiconductor wafer prior to formation into each semiconductor chip 9, a re-interconnect 15b as illustrated in FIG. 6 for substitution is formed.

The re-interconnect 15b has a Cr seed layer 15c for connecting to the Al pad 9a of the semiconductor chip 9, a Cu seed layer 15d for connecting to the Cr seed layer 15c, a Cu plated layer 15e for connecting to the Cu seed layer 15d and an Ni plated layer 15f for connecting to the Cu plated layer 15e.

The re-interconnect 15b of the CSP 15 is formed in the following manner. First, as illustrated in FIG. 10, an insulating film 15h and a first protective film 15i are formed over the Al pad 9a of the semiconductor chip 9 while exposing the central portion of the pad.

Figure 11:
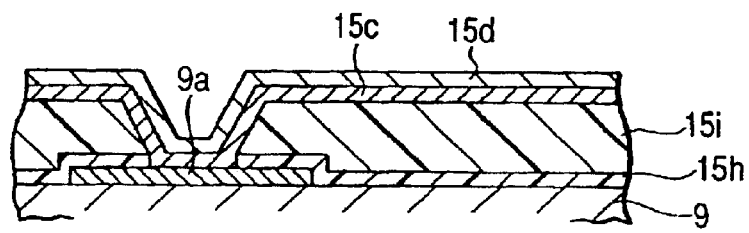
FIG. 11 is a fragmentary cross-sectional view illustrating one example of a plate seed layer forming step in the manufacturing procedure of the CSP mounted on the multi-chip module in FIG. 3.

Then, as illustrated in FIG. 11, the Cr seed layer 15c and Cu seed layer 15d for power supply plating are formed over the first protective film 15i and the exposed portion of the Al pad 9a by sputtering.

Figure 12:
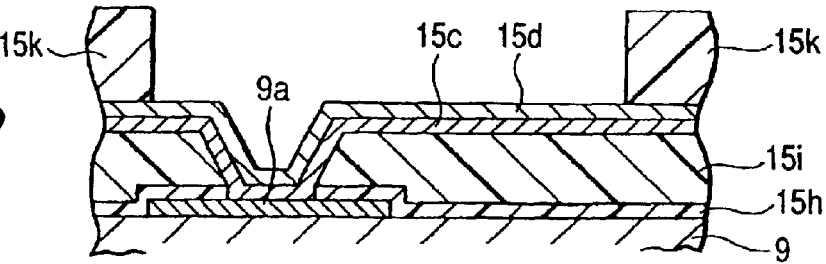
FIG. 12 is a fragmentary cross-sectional view illustrating one example of a resist patterning step in the manufacturing procedure of the CSP mounted on the multi-chip module in FIG. 3.

As illustrated in FIG. 12, a resist film 15k is formed, followed by patterning of the resist film 15k.

Figure 13:
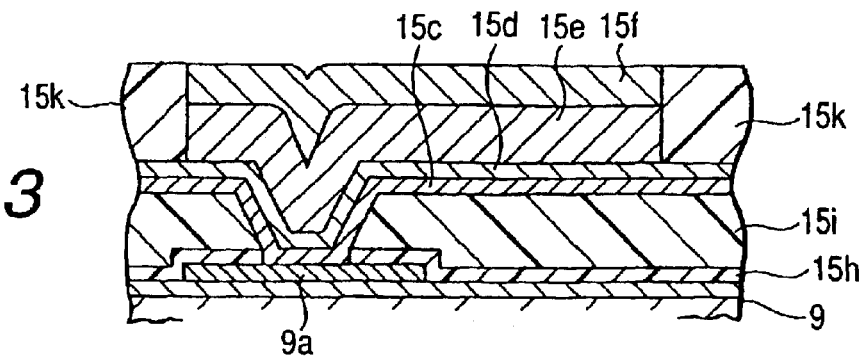
FIG. 13 is a fragmentary cross-sectional view illustrating one example of a Ni/Cu plating step in the manufacturing procedure of the CSP mounted on the multi-chip module in FIG. 3.

As illustrated in FIG. 13, the Cu plated layer 15e and Ni plated layer 15f are formed by electroplating in the patterned regions of the resist film 15k while using the Cr seed layer 15c and Cu seed layer 15d as power supply interconnects.

Figure 14:
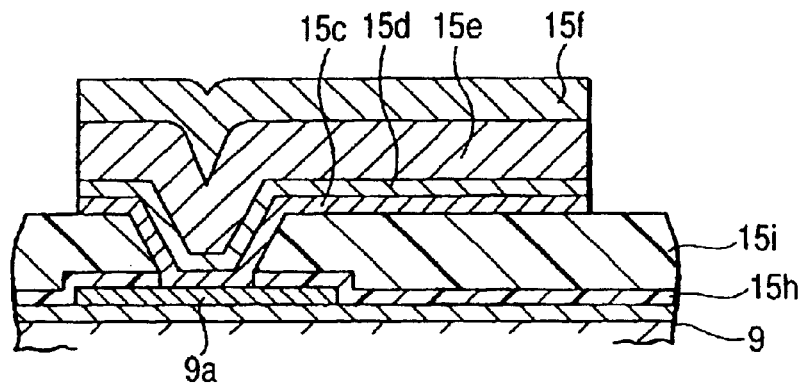
FIG. 14 is a fragmentary cross-sectional view illustrating one example of a resist removing step in the manufacturing procedure of the CSP mounted on the multi-chip module in FIG. 3.

As illustrated in FIG. 14, the resist film 15k is removed and by dry etching with the Cu plated layer 15e and Ni plated layer 15f as masks, the Cr seed layer 15c and Cu seed layer 15d are patterned.

Figure 15:
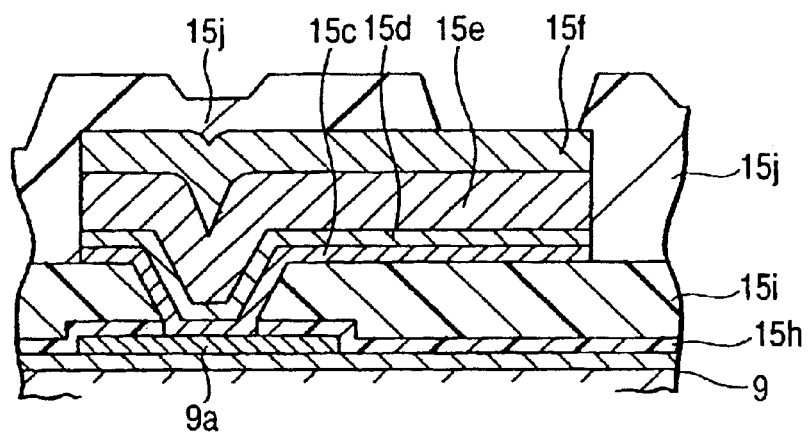
FIG. 15 is a fragmentary cross-sectional view illustrating one example of a second protective film forming step in the manufacturing procedure of the CSP mounted on the multi-chip module in FIG. 3.

Then, over the Ni plated layer 15f, a second protective film 15j is formed while exposing a portion thereof as illustrated in FIG. 15.

Figure 16:
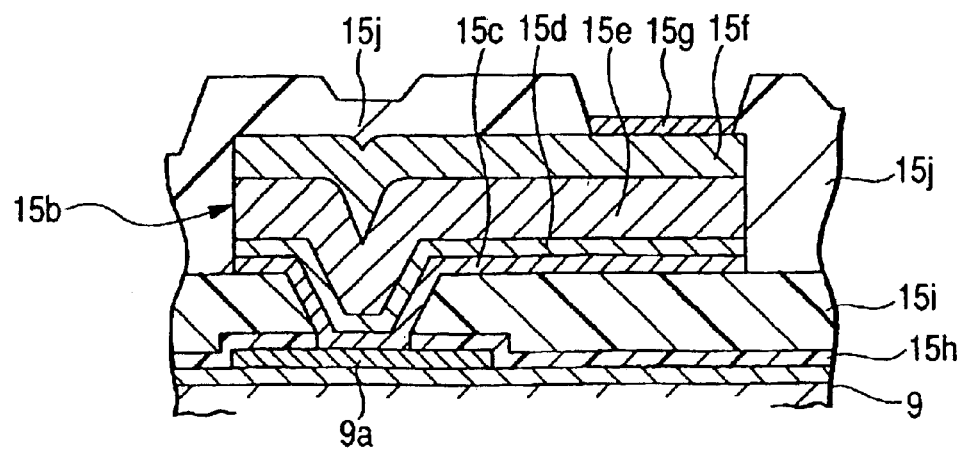
FIG. 16 is a fragmentary cross-sectional view illustrating one example of an Au plated layer forming step in the manufacturing procedure of the CSP mounted on the multi-chip module in FIG. 3.

As illustrated in FIG. 16, an Au film 15g is formed on the exposed region of the Ni plated layer 15f by electroless plating.

As a result, the Al pad 9a of the semiconductor chip 9 is electrically connected to the Au film 15g exposed on the surface by this re-interconnect 15b.

Thus, a seed layer, which will be an interconnect for supplying power for electroplating, is formed over the whole surface of an Si substrate by sputtering and then, patterned by dry etching with the plated layer formed thereon with a mask. It therefore becomes unnecessary to equip each of the re-interconnects 15b with a power supply interconnect for electroplating, making it possible to apply electroplating to film formation of the re-interconnects 15b which are to be formed at a minute pitch.

To the wiring substrate 1 made of an organic resin having low heat resistance such as glass epoxy resin, it is difficult to apply the above-described sputtering or dry etching. In such a case, use of electroless plating is effective.

In the next place, a fabrication method of the multi-chip module 16 according to Embodiment 1 will be described.

As illustrated in FIG. 17, prepared is a module substrate 11 having a plurality of first electrodes 11a and a plurality of second electrodes 11b formed on the surface of the substrate on which a semiconductor device is to be mounted, and a plurality of opposite-side electrodes 11f formed on the opposite side. These opposite-side electrodes are arranged, for example, in the form of an array.

The first electrodes 11a, second electrodes 11b and opposite-side electrodes 11f are each made of a Cu interconnect 2 or a Cu interconnect 11c containing Cu, an Ni film 4 or an Ni film 11d formed over the Cu interconnect 2 or 11c and containing Ni and P (phosphorous), and an Au film 5 or an Au film 11e formed over the Ni film 4 or Ni film 11d and containing Au, respectively.

As illustrated in FIG. 18, a semiconductor chip 9 is mounted on the module substrate 11. After mounting, as illustrated in FIG. 7, the Au film 11e of each of the plurality of second electrodes 11b is electrically connected to an Al pad 9a of the semiconductor chip 9 via an Au wire 10.

As illustrated in FIG. 19, a sealing resin 12 is then dropped onto the semiconductor chip 9 and the Au wire 10 by potting, whereby resin sealing is conducted.

As illustrated in FIG. 6 and FIG. 20, each of solders containing Sn and any one of Ba, Be, Ca and Mg is disposed on each of the plurality of first electrodes 11a on the module substrate 11, followed by disposal of a CSP 15 on the solders while aligning each of the solders with the surface electrode 15a.

Each of the above-described solders contains an additive (for example, the above-described alkaline earth metal such as Ba, Be, Ca or Mg) having higher reactivity with P (phosphorous) than Sn. These solders are molten by reflow.

Upon reflow, a P compound 7 which is a compound of the additive with P contained in the Ni film 4 is generated in the molten solders.

Simultaneously with melting, an Sn—Ni alloy layer 8 made of an alloy containing Sn and Ni is formed by reacting Sn contained in each of the solders with Ni contained in the Ni film.

In the multi-chip module 16 according to this Embodiment 1, the P compound 7 is dispersed in the solder upon melting of the solder. As a result, a P concentrated layer 14 as illustrated in FIG. 29 is not formed in the Ni film 4.

This makes it possible to improve the solder bonding property, thereby preventing peeling of the solder from the first electrode 11a upon solder reflow.

Then, solder bumps 6 are formed by solidifying the solders on the plurality of first electrodes 11a, whereby the CSP 15 is mounted on the module substrate 11 via the solder bumps 6.

As illustrated in FIG. 21, a plurality of solder external electrodes 18 are disposed over the plurality of opposite-side electrodes 11f on the module substrate 11 by reflow as in the above-described solder.

The solder used for the solder external electrodes 18 preferably contains an additive (for example, the above-described alkaline earth metal such as Ba, Be, Ca or Mg) having a high reactivity with P (phosphorous) than Sn. The P compound 7 which is a compound of the additive with P contained in the Ni film 4 is generated in the molten solder. Simultaneously with melting, an Sn—Ni alloy layer 8 made of an alloy containing Sn and Ni is formed by reacting Sn contained in the solder with Ni contained in the Ni film 4.

Accordingly, even in the solder external electrodes 18, a P-concentrated layer 14 as illustrated in FIG. 29 is not formed in the Ni film 4.

(Embodiment 2)

Figure 22:
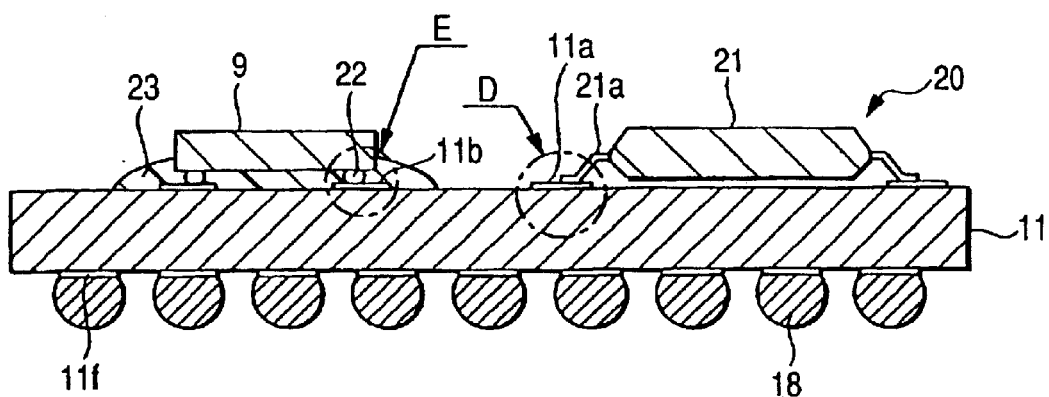
FIG. 22 is a cross-sectional view illustrating the structure of a multi-chip module which is one example of an electronic device according to Embodiment 2 of the invention.
Figure 23:
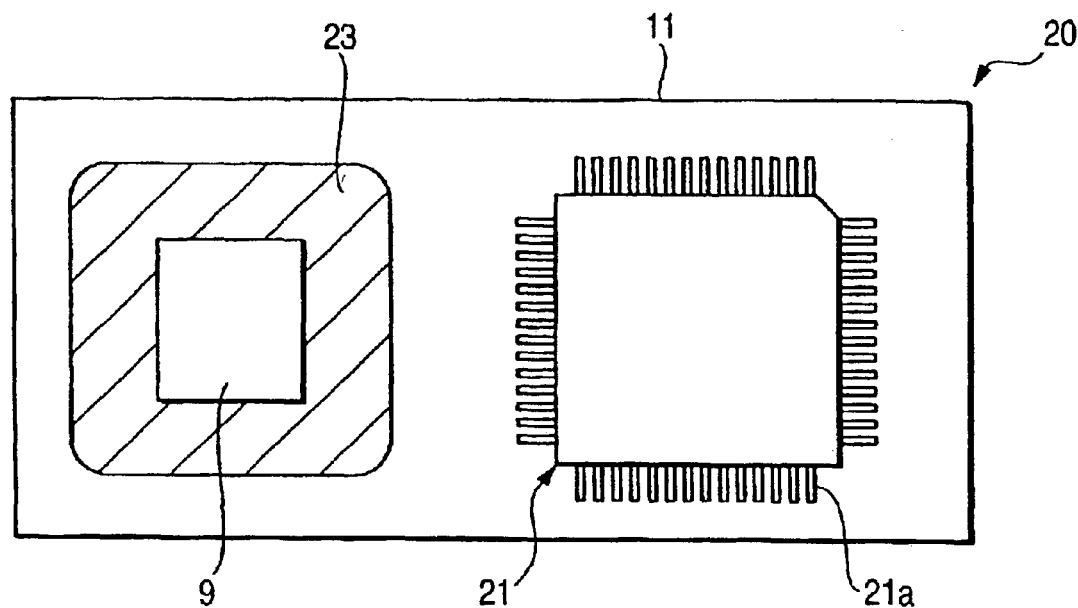
FIG. 23 is a plain view of the multi-chip module in FIG. 22.
Figure 24:
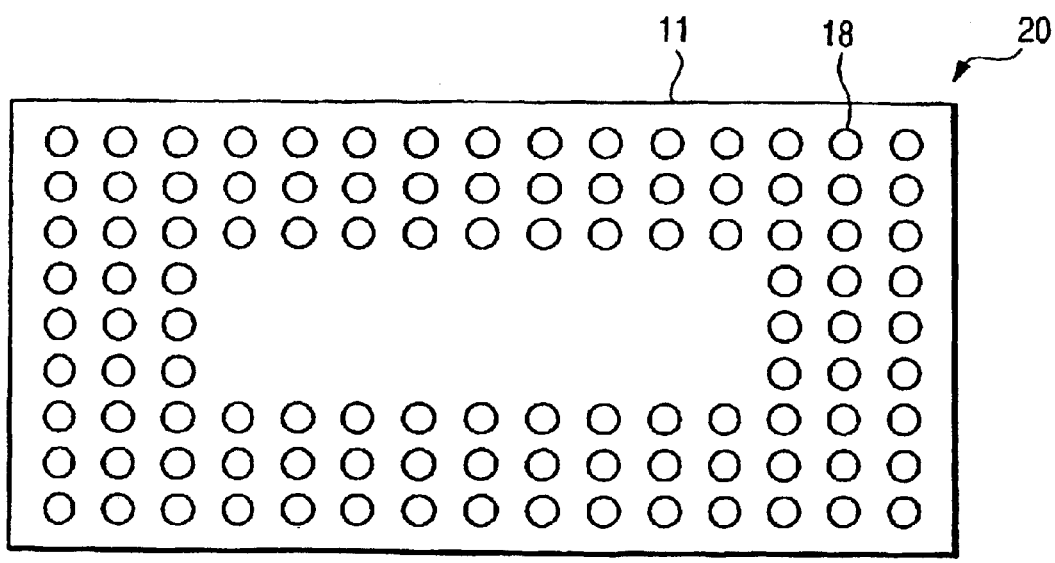
FIG. 24 is a bottom view of the multi-chip module in FIG. 22.
Figure 25:
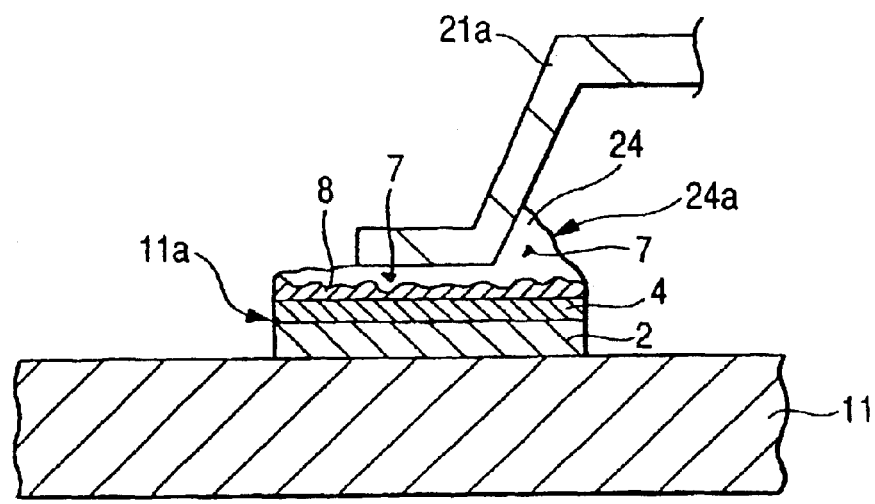
FIG. 25 is a fragmentary enlarged cross-sectional view illustrating the structure of Portion D illustrated in FIG. 22.
Figure 26:
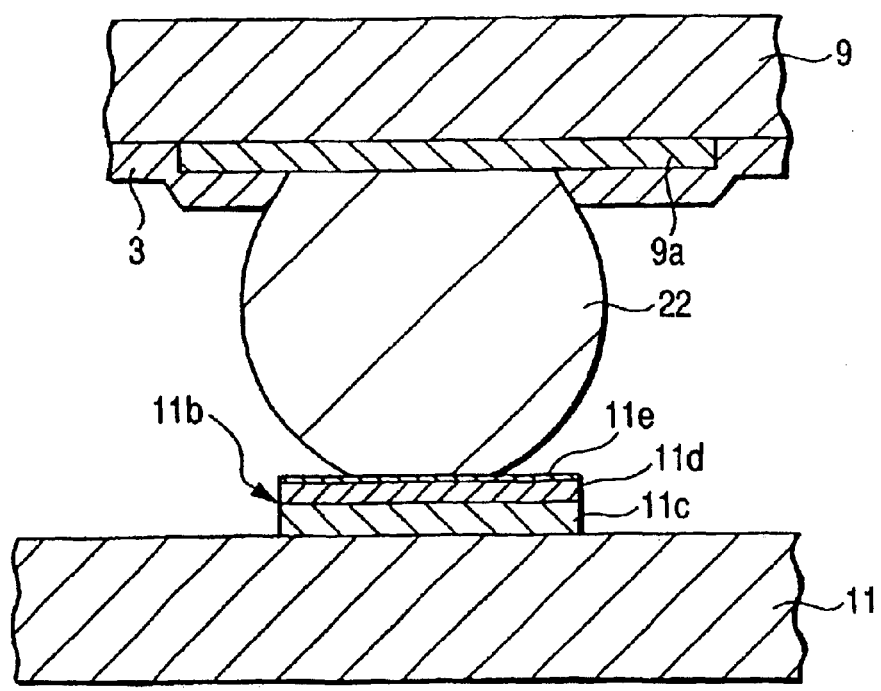
FIG. 26 is a fragmentary enlarged cross-sectional view illustrating the structure of Portion E illustrated in FIG. 22.
Figure 27:
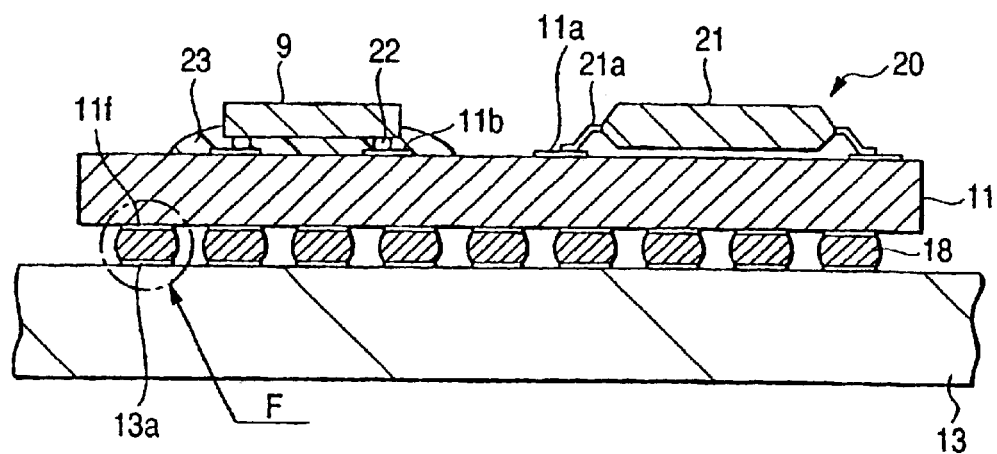
FIG. 27 is a fragmentary cross-sectional view illustrating one example of a package structure of the multi-chip module in FIG. 22.
Figure 28:
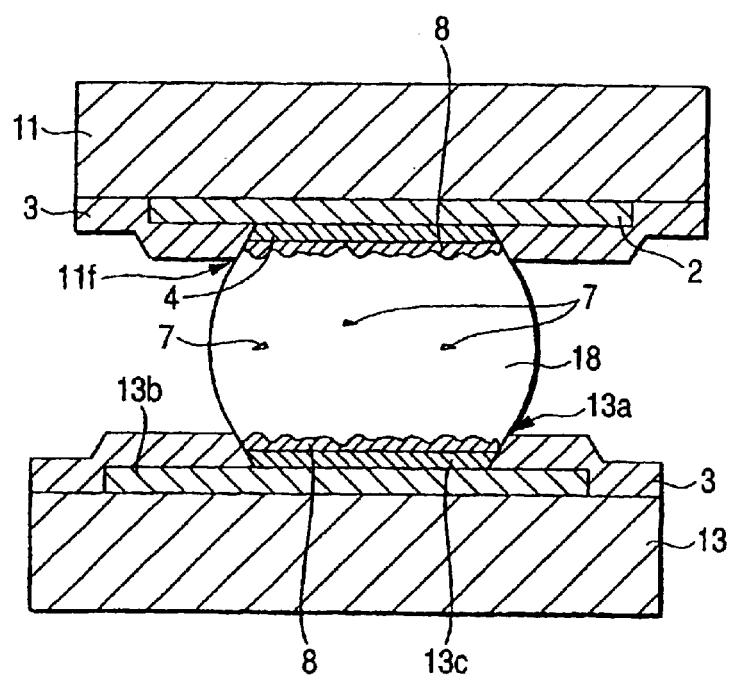
FIG. 28 is a fragmentary enlarged cross-sectional view illustrating the structure of Portion F in FIG. 27.

FIG. 22 is a cross-sectional view illustrating the structure of a multi-chip module which is one example of an electronic device according to Embodiment 2 of the invention; FIG. 23 is a plain view of the multi-chip module in FIG. 22; FIG. 24 is a bottom view of the multi-chip module in FIG. 22; FIG. 25 is a fragmentary enlarged cross-sectional view illustrating the structure of Portion D illustrated in FIG. 22; FIG. 26 is a fragmentary enlarged cross-sectional view illustrating the structure of Portion E illustrated in FIG. 22; FIG. 27 is a fragmentary cross-sectional view illustrating one example of the package structure of the multi-chip module in FIG. 22; and FIG. 28 is a fragmentary enlarged cross-sectional view illustrating the structure of Portion F in FIG. 27.

In this Embodiment 2, a multi-chip module 20 as illustrated in FIGS. 22 to 24 will be described as one example of an electronic device to which soldering as illustrated in FIG. 1 has been applied.

The multi-chip module 20 according to Embodiment 2 adopts a module substrate 11 similar to that used for the multi-chip module 16 of Embodiment 1 except that on the module substrate 11 are mounted a QFP (Quad Flat Package) 21 which is a semiconductor device having an outer lead 21a and, via an Au protruding electrode 22 which is a connector, a semiconductor chip 9.

As illustrated in FIG. 25, the outer lead 21a of the QFP 21 is soldered onto a first electrode 11a, similar to the surface electrode 15a of the CSP 15 of Embodiment 1, via a solder portion 24 while further having a solder fillet 24a.

The solder used for this solder portion 24 contains, as in Embodiment 1, an additive (for example, an alkaline earth metal such as Ba, Be, Ca or Mg) having a high reactivity with P (phosphorous) than Sn.

As in Embodiment 1, a P compound 7 which is a compound of the additive with P contained in the Ni film 4 is generated in the molten solder upon solder reflow. Simultaneously with melting, an Sn—Ni alloy layer 8 made of an alloy containing Sn and Ni is formed by reacting Sn contained in the solder with Ni contained in the Ni film 4.

Also in the multi-chip module 20, the P compound 7 is dispersed in the solder upon melting of the solder. As a result, a P concentrated layer 14 as illustrated in FIG. 29 is not formed in the Ni film 4. This makes it possible to improve the solder bonding property, thereby preventing peeling of the solder from the first electrode 11a upon solder reflow.

As illustrated in FIG. 26, the semiconductor chip 9 is mounted, as a second semiconductor device, on the second electrode 11b of the module substrate 11 via an Au protruding electrode 22 which is a connector illustrated in FIG. 26.

Described specifically, a plurality of Au-containing connectors are bonded to a plurality of Al pads 9a of the semiconductor chip 9, respectively. At the same time, they are Au protruding electrodes 22 each pressure-bonded onto the plurality of second electrodes 11b. Similar to the Au wire 10 as illustrated in FIG. 7, the Au film 11e of the second electrode 11b and the Au protruding electrode 22 are bonded through Au—Au bonding.

The semiconductor chip 9 on the module substrate 11 is sealed and protected, at the periphery of its Au protruding electrode 22, by an underfill resin 23, as illustrated in FIGS. 22 and 23.

As illustrated in FIG. 24, a plurality of solder external electrodes 18 are arranged in the form of an array on the other side of the module substrate 11 as in the multi-chip module 16 of Embodiment 1.

As illustrated in FIG. 27, the multi-chip module 20 is packaged on a mother board 13 via the solder external electrodes 18.

The package form of the multi-chip module 20 as illustrated in FIGS. 27 and 28 is similar to that of the multi-chip module 16 of Embodiment 1 as illustrated in FIGS. 8 and 9 so that overlapping descriptions will be omitted.

Other advantages available by the multi-chip module 20 of Embodiment 2 are also similar to those available by the multi-chip module 16 of Embodiment 1 so that overlapping descriptions will be omitted.

Upon fabrication of the multi-chip module 20, after preparation of the module substrate 11, the semiconductor chip 9 is mounted by Au—Au bonding on the second electrode 11b via the Au protruding electrode 22 as illustrated in FIG. 26.

Underfill sealing is then conducted by injecting the underfill resin 23 between the semiconductor chip 9 and the module substrate 11.

Over the first electrode 11a, a solder containing an additive (for example, the above-described alkaline earth metal such as Ba, Be, Ca or Mg) having a higher reactivity with P (phosphorous) than Sn, followed by disposal of an outer lead 21a of QFP 21 over the solder.

The solder is then molten by reflow.

Upon reflow, the P compound 7 which is a compound of the additive with P contained in the Ni film 4 is generated in the molten solder.

Simultaneously with melting, an Sn—Ni alloy layer 8 made of an alloy containing Sn and Ni is formed by reacting Sn contained in each of the solder with Ni contained in the Ni film 4.

In the multi-chip module 20 according to Embodiment 2, the P compound 7 is dispersed, as in Embodiment 1, in the solder upon melting of the solder. As a result, a P concentrated layer 14 as illustrated in FIG. 29 is not formed in the Ni film 4.

This makes it possible to improve the solder bonding property, thereby preventing peeling of the solder from the first electrode 11a upon solder reflow.

The solder is solidified on each of the plurality of first electrodes 11a. As illustrated in FIG. 25, the solder fillet 24a is formed and at the same time, the outer lead 21a is bonded onto the first electrode 11a via the solder portion 24, whereby the QFP 21 is mounted on the module substrate 11 via the solder portion 24.

Then, solder reflow is conducted on the plurality of opposite-side electrodes 11f on the module substrate 11 to dispose the plurality of solder external electrodes 18.

The solder used for the solder external electrodes 18 preferably contains an additive (for example, the above-described alkaline earth metal such as Ba, Be, Ca or Mg) having a high reactivity with P (phosphorous) than Sn. The P compound 7 which is a compound of the additive with P contained in the Ni film 4 is formed in the molten solder. Simultaneously with melting, an Sn—Ni alloy layer 8 made of an alloy containing Sn and Ni is formed by reacting Sn contained in the solder with Ni contained in the Ni film 4.

Accordingly, even in the solder external electrodes 18 of the multi-chip module 20, a P-concentrated layer 14 as illustrated in FIG. 29 is not formed in the Ni film 4.

The invention made by the inventors was described specifically based on Embodiments of the invention. It should be noted that the present invention is not limited by these embodiments, but can be modified within an extent not departing from the scope of the invention.

For example, in Embodiments 1 and 2, any one of alkaline earth metals such as Ba, Be, Ca and Mg is used as an additive to the solder, but these alkaline earth metals such as Ba, Be, Ca and Mg may be used in combination.

In Embodiments 1 and 2, the Au wire 10 or Au protruding electrode 22 was used as a connector, but any member (conductor) is usable insofar as it contains Au and can be electrically connected.

In Embodiments 1 and 2, multi-chip modules 16,20 which are electronic devices were given as appliation examples of soldering. The soldering can be applied to a semiconductor device if the module substrate 11 is replaced with the interposer 1.

Examples of a semiconductor device to which the above-described soldering can be applied may include an interposer 1 (refer to FIG. 1) having, mounted thereon, only CSP 15 of the multi-chip module 16 as illustrated in FIG. 3 or only QFP 21 of the multi-chip module 20 as illustrated in FIG. 22, and a semiconductor device (including multi-chip package) obtained by flip-chip packaging of one or plural semiconductor chips 9 on the interposer 1. In such a case, use of the solder employed in Embodiment 1 or 2 makes it possible to improve the solder bonding property and at the same time, to manufacture a highly reliable semiconductor device. It is particularly effective for semiconductor devices for high-frequency apparatuses which need electroless plating.

In Embodiments described herein, an alkaline earth metal such as Ba, Be, Ca or Mg was added to the solder. The additive is however not limited to these alkaline earth metals, but a solder added with an additive other than alkaline earth metals and capable of forming a compound with P in the Ni film and existing in the diffused or dispersed form in the solder can be employed.

In Embodiments described herein, the substance contained in the Ni film was only P. The present invention is however not applicable only to such a case, but also to the case where Ni film contains a substance other than P which is capable of preventing Au penetration in the form of cracks upon Au plating.

In short, it is possible to prevent lowering of the bonding strength of a solder bump by preliminary adding thereto an additive—which forms a compound with a substance contained in the Ni film and exists in the diffused form in the solidified solder bump—in order to prevent formation of a concentrated layer of the substance upon solder bump formation.

Advantages available by the typical inventions disclosed by the present application will next be described simply.

By carrying out soldering by the reflow of a solder added with an alkaline earth metal such as Ba, Be, Ca or Mg, a compound of P can be formed in the molten solder. This makes it possible to prevent the formation of a P concentrated layer in the Ni film, resulting in an improvement in the solder bonding property and prevention of peeling of the solder upon solder reflow.

What is claimed is:

1. A manufacturing method of a semiconductor device comprising a wiring substrate, a plurality of electrodes formed over said wiring substrate, and a semiconductor chip electrically connected to said plurality of electrodes, comprising the steps of:
   (a) providing the wiring substrate with the plurality of electrodes made of a first conductor film containing Cu, a second conductor film formed over said first conductor film and containing Ni and P, and a third conductor film formed over said second conductor film and containing Au;
   (b) melting a solder containing Sn and any one of Ba, Be, Ca and Mg over said plurality of electrodes of the wiring substrate prepared in said step (a); and
   (c) subsequent to said step (b), solidifying said solder over said plurality of electrodes.

2. A manufacturing method according to claim 1, wherein in said solder melting step, an Sn/Ni-containing alloy is formed using Sn contained in said solder and Ni contained in said second conductor film.

3. A manufacturing method of a semiconductor device comprising a wiring substrate having a principal surface and a surface opposite thereto, a plurality of principal-side electrodes formed on the principal surface and a plurality of opposite-side electrodes formed on the opposite surface, a plurality of protruding electrodes formed on the plurality of second electrodes, and a semiconductor chip electrically connected with said plurality of protruding electrodes via said plurality of principal-side electrodes and said plurality of opposite-side electrodes, comprising the steps of:
   (a) providing the wiring substrate with the plurality of principal-side and opposite-side electrodes each made of a first conductor film containing Cu, a second conductor film formed over said first conductor film and containing Ni and P, and a third conductor film formed over said second conductor film and containing Au;
   (b) electrically connecting said plurality of principal-side electrodes of said wiring substrate prepared in said step (a) to said semiconductor chip via Au-containing connectors, respectively;
   (c) melting a solder containing Sn and any one of Ba, Be, Ca and Mg over said plurality of opposite-side electrodes of said wiring substrate prepared in said step (a); and
   (d) subsequent to said step (c), solidifying said solder over said plurality of opposite-side electrodes so as to form said plurality of protruding electrodes.

4. A manufacturing method according to claim 3, wherein said step (b) comprises a step of bonding a plurality of Au wires to said plurality of principal-side electrodes and said semiconductor chip, respectively.

* * * * *